United States Patent
Storck et al.

(10) Patent No.: US 8,093,143 B2
(45) Date of Patent: Jan. 10, 2012

(54) METHOD FOR PRODUCING A WAFER COMPRISING A SILICON SINGLE CRYSTAL SUBSTRATE HAVING A FRONT AND A BACK SIDE AND A LAYER OF SIGE DEPOSITED ON THE FRONT SIDE

(75) Inventors: Peter Storck, Burghausen (DE); Thomas Buschhardt, Burghausen (DE)

(73) Assignee: Siltronic AG, Munich (DE)

( * ) Notice: Subject to any disclaimer, the term of this patent is extended or adjusted under 35 U.S.C. 154(b) by 133 days.

(21) Appl. No.: 12/724,584

(22) Filed: Mar. 16, 2010

(65) Prior Publication Data
US 2010/0291761 A1 Nov. 18, 2010

(30) Foreign Application Priority Data
May 13, 2009 (EP) .................................. 09006476

(51) Int. Cl.
*H01L 21/36* (2006.01)
(52) U.S. Cl. .......... 438/493; 438/752; 438/933; 257/19; 257/E33.009; 257/E31.035; 257/E29.193; 257/E21.09; 257/E21.093; 257/E21.102; 257/E21.182; 257/E21.207
(58) Field of Classification Search .................. None
See application file for complete search history.

(56) References Cited

U.S. PATENT DOCUMENTS

| | | | |
|---|---|---|---|
| 4,925,809 A | 5/1990 | Yoshiharu et al. | |
| 2003/0033974 A1 | 2/2003 | Ueda | |
| 2004/0072409 A1* | 4/2004 | Fitzgerald et al. | 438/455 |
| 2008/0017952 A1 | 1/2008 | Cody et al. | |
| 2009/0087961 A1* | 4/2009 | Hartmann et al. | 438/457 |

FOREIGN PATENT DOCUMENTS

| | | |
|---|---|---|
| EP | 0798765 A2 | 10/1997 |
| EP | 1684335 A1 | 7/2006 |
| WO | 2004030060 A1 | 4/2004 |

* cited by examiner

*Primary Examiner* — Charles Garber
*Assistant Examiner* — Yasser Abdelaziez
(74) *Attorney, Agent, or Firm* — Brooks Kushman P.C.

(57) ABSTRACT

A method for producing a wafer with a silicon single crystal substrate having a front and a back side and a layer of SiGe deposited on the front side, the method using steps in the following order:
  simultaneously polishing the front and the back side of the silicon single crystal substrate;
  depositing a stress compensating layer on the back side of the silicon single crystal substrate;
  polishing the front side of the silicon single crystal substrate; cleaning the silicon single crystal substrate having the stress compensating layer deposited on the back side; and
  depositing a fully or partially relaxed layer of SiGe on the front side of the silicon single crystal substrate.

6 Claims, 2 Drawing Sheets

METHOD FOR PRODUCING A WAFER COMPRISING A SILICON SINGLE CRYSTAL SUBSTRATE HAVING A FRONT AND A BACK SIDE AND A LAYER OF SIGE DEPOSITED ON THE FRONT SIDE

CROSS-REFERENCE TO RELATED APPLICATIONS

This application claims priority to European Patent Application No. 09006476 filed May 13, 2009 which is herein incorporated by reference.

BACKGROUND OF THE INVENTION

1. Field of the Invention

The subject invention pertains to a process for the production of semiconductor wafers having a heteroepitaxial SiGe layer on the front side, and having reduced amounts of threading dislocations, cross hatch, and misfit dislocations, while also offering reduced bow, warp, and improved global and local flatness.

2. Background Art

A crystalline heteroepitaxial layer of SiGe deposited on a silicon single crystal substrate by epitaxial deposition typically differs from the substrate in several material properties including crystal lattice dimensions and thermal expansion coefficient. SiGe deposition on Si is a well known system to increase the lattice constant from Si to pure Ge which has a lattice constant being 4.2% larger than that of Si. Hereinafter, SiGe is an abbreviation of $Si_{(1-x)}Ge_x$, wherein x represents a value in the range of from 0.2 to 1.0. During the early stages of the deposition the heteroepitaxial SiGe layer is strained with respect to the underlying substrate lattice. After exceeding a certain layer thickness (critical thickness) the crystal of the heteroepitaxial layer starts to relax via the insertion of so called misfit dislocations (MFD). Although oriented in the plane perpendicular to the growth direction not all MFD extend to the edge of the substrate wafer but a certain number bend and form threading dislocations (TD) propagating through the growing layer to the surface. TD forming clusters along lines are called pile ups (PU) and are especially harmful for electronic devices. The stress fields from the dislocation network also cause a surface roughening called cross-hatch. The formation of MFD, PU, TD, cross-hatch and a bending of the wafer (bow, warp) are mechanisms by which the strain from the lattice mismatch is relieved. Many epitaxial deposition techniques have been developed to reduce the negative effects of the strain relaxation on the crystal quality of the heteroepitaxial layer. Grading of the Ge concentration in the SiGe layer has been a successful way to reduce the density of TD and PU and the surface roughness of so-called SiGe buffer layers. Many variations of grading the Ge concentration to match the crystal lattice of Si to the intended crystal lattice constant at the surface of the graded SiGe buffer layer have been developed. For example, the concentration of Ge in the SiGe buffer layer is graded continuously or in steps.

So far little attention has been given to the reactions after the deposition has ended. Typically the deposition is done by heating a silicon single crystal substrate wafer to a certain temperature and then providing the components for growing a film in the gas phase (e.g. CVD, PVD, MBE). When the film growth ends the film is fully or partially relaxed with regard to the substrate. Sometimes annealing steps are applied to fully relax the SiGe buffer. After the deposition is completed the cooling of the layered wafer starts. Because of the difference in thermal expansion coefficient between heteroepitaxial layer and substrate new stress is generated. The stress components effect the layer properties in a similar way as stress introduced by lattice mismatch during film growth. Secondary relaxation, bowing of the wafer and roughening of the surface are the mechanisms to release this stress.

Attempts have been made to reduce the bowing of the wafer. Such attempts have been successful to a certain extent by providing thin intermediate layers of strained Si in the heteroepitaxial layer. An approach of this kind is disclosed in US2008/0017952 A1, another one in US2009/0087961 A1.

According to US2003/0033974 A1 a flat epitaxial wafer having III-V nitride layers without defects and micro cracks may be obtained by depositing such layers on the front and the back side of a substrate.

These methods have all been used to compensate the bowing of the wafer caused by the stress generated by a heteroepitaxial front side layer. The present invention intends to provide a method which uses the stress generated by a backside layer to change the growth and cooling mechanism of the heteroepitaxial front side layer and thereby improving the crystal quality of the front side layer, especially the TDD and surface roughness caused by cross-hatch generation.

The provision of the stress compensating layer prevents a degradation of the heteroepitaxial layer during the phase after cooling down the wafer from the deposition temperature. After the deposition, the heteroepitaxial layer is in a fully or partially relaxed state depending on the conditions during deposition. When the film forming gases are turned off, the wafer is usually cooled down in a controlled manner. Due to the thermal mismatch of the substrate and the heteroepitaxial layer, new stress is generated and causes a set of secondary relaxation processes. These include the formation of secondary dislocations, roughening of the surface and also bowing of the wafer. Typically a strong increase in the density of TD and the surface roughness towards the wafer edge would be observed. However, depositing a stress compensating layer providing the desired amount of stress on the back side of the substrate before depositing the heteroepitaxial layer counteracts the generation of new stress, eliminates the center to edge non-uniformity in terms of RMS-roughness, reduces the density of TD and the roughness caused by cross-hatch and improves the bow of the wafer.

However, although the deposition of a stress compensating layer prior to the deposition of the heteroepitaxial layer on the front side solves the issues regarding defects of the heteroepitaxial layer and bowing of the wafer, other wafer parameters can suffer significantly. Most important for the fabrication of advanced CMOS transistors for sub-45 nm device generations are parameters related to the geometry of the wafer especially global and local flatness parameters (SFQR, SBIR) and nanotopography.

The process flow for producing a heteroepitaxial 300 mm wafer suitable for 32 nm device generation and below needs to be improved to fulfill the tight specifications regarding these parameters despite adding the stress compensating layer on the backside and the heteroepitaxial layers on the front side of a wafer.

SUMMARY OF THE INVENTION

It is an object of the present invention to provide a method for producing a wafer comprising a silicon single crystal substrate and having a heteroepitaxial layer of SiGe deposited on the front side of the substrate and a stress compensating layer on the back side, the wafer having improved global and local flatness parameters and nanotopography. The object is met by a method for producing a wafer comprising a silicon single crystal substrate having a front and a back side and a layer of SiGe deposited on the front side, the method comprising steps in the following order:

simultaneously polishing the front and the back side of the silicon single crystal substrate;

depositing a stress compensating layer on the back side of the silicon single crystal substrate;

polishing the front side of the silicon single crystal substrate;

cleaning the silicon single crystal substrate having the stress compensating layer deposited on the back side; and depositing a fully or partially relaxed layer of SiGe on the front side of the silicon single crystal substrate.

DETAILED DESCRIPTION OF THE PREFERRED EMBODIMENT(S)

Figure 1:
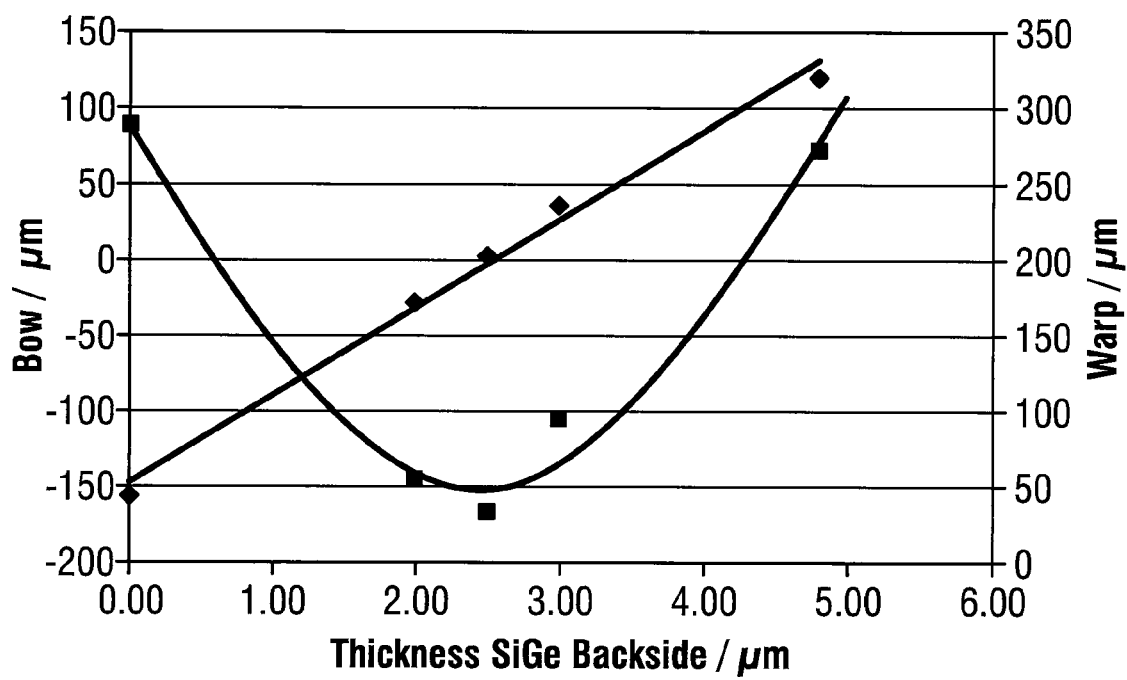
FIG. 1 is a calibration curve useful for determining the thickness of the SCL.

The invention provides a stress compensating layer (SCL) on the backside of the substrate. The SCL is deposited on the backside of the substrate and before the deposition of a fully or partially relaxed SiGe buffer layer (hereinafter also called "heteroepitaxial layer") on the front side of the substrate. The SCL is advantageously grown in such a way as to provide an appropriate amount of stress for compensating the stress which is generated when the wafer cools down from a deposition temperature after depositing the heteroepitaxial layer on the front side of the substrate. An appropriate amount of compensating stress is achieved according to one embodiment of the invention, if the thickness and the composition of the SCL is chosen in such a way so as to provide the desired amount of stress. This can be achieved according to one embodiment of the invention, if the compensating stress layer comprises a constant composition SiGe layer and either the thickness or the composition of the constant composition SiGe layer or both are used for stress control. In principle, this approach is independent of the composition and thickness of the heteroepitaxial layer. Increasing the thickness of the constant composition SiGe layer or increasing the concentration of Ge in the constant composition SiGe layer or increasing both will increase the stress available for compensating the stress caused by the heteroepitaxial layer during cooling. The concentration of Ge in the constant composition SiGe layer is preferably chosen within a range of from 10 to 80%.

Details regarding the individual steps of the claimed method may be described as follows: During simultaneous double side polishing (DSP), the substrate is held in a carrier and polished in the presence of a polishing slurry between two rotating polishing pads. It is preferred to polish the wafer to a final thickness required to compensate the thickening of the wafer caused by adding the epitaxial layers on the front- and backside. The material removal preferably equals substantially the sum of the thicknesses of layers which are deposited on the substrate in the course of the preparation of the heteroepitaxial wafer so that the thickness of the final wafer product does not exceed a target thickness. The target thickness is preferably the thickness of a commonly used epitaxial wafer having the same diameter as the heteroepitaxial wafer. For example, the thickness of an epitaxial wafer having a diameter of 300 mm is typically in the range of 772 to 778 µm. If, for example, all front and back side epitaxial layers add 11 µm (removal by intermediate CMP steps taken into account) to the final thickness, the substrate wafer is double side polished preferably to 761 to 767 µm thickness.

After DSP, the substrate is preferably cleaned and dried, and then a stress compensating layer is deposited by chemical vapor deposition (CVD) on the back side of the silicon substrate. The SCL comprises a SiGe layer. The thickness and the composition of the SiGe layer is chosen to generate stress which substantially compensates for the stress which is generated after the deposition of the heteroepitaxial layer on the front side of the substrate. According to a first embodiment of the invention, the stress compensating layer has substantially the same or similar thickness and composition as the heteroepitaxial layer. According to a second embodiment of the invention, the SCL comprises a SiGe layer with constant composition. Either the thickness of the SCL or the content of Ge in the constant composition or both are chosen to control the stress of the SCL for substantially compensating for the stress of the heteroepitaxial layer on the front side of the substrate. A sealing cap layer of silicon having a thickness of preferably not more than 100 nm and preferably not less than 5 nm may be deposited on the SCL. The cap layer improves handling and cleaning operations which may be included in the further manufacturing process.

After the deposition of the SCL on the back side of the substrate, the front side of the substrate is polished by chemical mechanical polishing (CMP). During CMP the substrate is pressed with a carrier against a rotating polishing pad and polished in the presence of a polishing slurry. This step primarily improves the local flatness and the nanotopography of the heteroepitaxial wafer. The amount of material which is removed by CMP is preferably about 0.5 µm-1.5 µm. This removal is preferably taken into account so that the wafer meets the total thickness specification after depositing the fully or partially relaxed layer of SiGe on the front side of the silicon substrate.

Further, the substrate is subjected to a post-CMP cleaning step which is preferably performed in a single wafer cleaning device. The cleaning solution may be water or an aqueous cleaning agent, in particular SC1/SC2 cleaning-type cleaning solutions with concentrations and temperatures modified for SiGe surfaces.

After the post-CMP cleaning of the substrate, a graded SiGe heteroepitaxial layer which is fully or partially relaxed is deposited on the front side of the substrate, preferably by CVD. The heteroepitaxial layer has preferably a concentration of Ge in the range of from 20.0 to 90.0%. The degree of Ge grading is preferably 10-20%/µm. The heteroepitaxial layer has a thickness which is preferably 1.0-9.0 µm.

The claimed method may comprise one or more additional steps, e.g. polishing the edge and the notch of the heteroepitaxial wafer after the deposition of the SiGe layer on the front side of the substrate. Additional CMP and post-CMP cleaning may be performed after DSP of the silicon single crystal substrate. One or more further epitaxial layer(s) may be deposited on the front side of the heteroepitaxial wafer, e.g. a constant composition SiGe layer on the graded SiGe heteroepitaxial layer and a strained silicon layer on the constant composition SiGe layer. The concentration of Ge in the constant composition SiGe layer is preferably 20 to 90%. CMP and post-CMP cleaning may be repeated before depositing a further epitaxial layer. CMP before depositing a further epitaxial layer may be replaced by a fixed abrasive polishing method which uses a pad with fixed abrasive particles instead of a slurry containing free abrasive particles.

Hereinafter, the invention is further explained by referring to the figures.

FIG. 1 represents a calibration curve for selecting an appropriate thickness of a 70% SiGe constant composition SCL. For example, for compensating the stress of a graded SiGe layer having a concentration of Ge in the range of 70% over 4.5 µm graded layer and a 1 µm 70% constant composition layer on the front side of the substrate, FIG. 1 suggests that a thickness of 2.5 µm of a constant composition 70%-SiGe—SCL would be appropriate to avoid bow (line fitted to diamond-shaped points) and to reduce warp to a minimum (curve fitted to square-shaped points).

Figure 2:
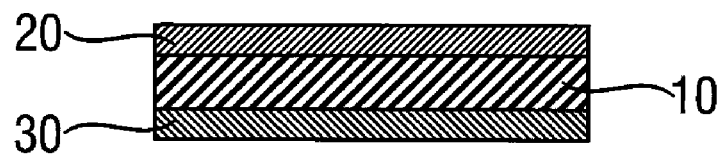
FIG. 2 illustrates one embodiment of a wafer prepared according to the invention.

FIG. 2 represents a heteroepitaxial wafer which is produced according to a first preferred embodiment of the present invention. The wafer comprises a silicon single crystal substrate 10 and a graded SiGe layer 20 deposited on the front side of the substrate. The wafer further comprises a stress compensating layer 30 deposited on the back side of the substrate. The stress compensating layer preferably comprises a constant composition SiGe layer having an appropriate thickness and composition for compensating the stress which is caused by the heteroepitaxial layer.

Figure 3:
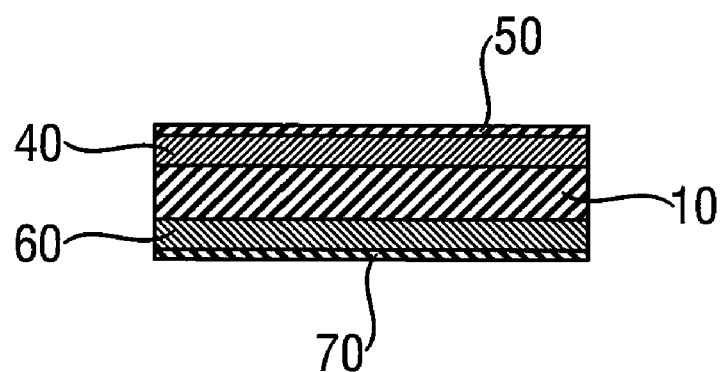
FIG. 3 illustrates a second embodiment of a wafer prepared according to the invention.

FIG. 3 represents a heteroepitaxial wafer which is produced according to a second preferred embodiment of the present invention. The wafer comprises a silicon single crystal substrate 10 and a heteroepitaxial layer deposited on the front side of the substrate, wherein the heteroepitaxial layer comprises a graded SiGe layer 40 deposited on the front side of the substrate and a constant composition SiGe layer 50 deposited on the graded SiGe layer. The wafer further comprises a stress compensating layer deposited on the back side of the substrate, wherein the stress compensating layer comprises a graded SiGe layer 60 deposited on the back side of the substrate and a constant composition SiGe layer 70 deposited on the graded SiGe layer. The stress compensating layer may have the same or a similar composition as the heteroepitaxial layer and the same or a similar thickness as the heteroepitaxial layer.

Figure 4:
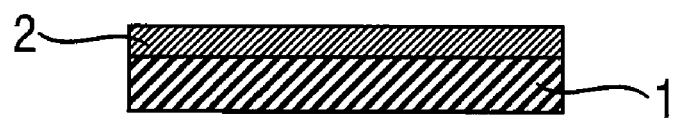
FIG. 4 illustrates a prior art wafer.

FIG. 4 represents a heteroepitaxial wafer which is commonly used. It comprises a silicon single crystal substrate 1 and an heteroepitaxial layer 2 deposited on the front side of the substrate.

The positive effect of the invention is demonstrated hereinafter by means of examples, which should not be construed as limiting the invention in any way.

EXAMPLE

Heteroepitaxial wafers as schematically depicted in FIG. 2 were produced by performing the following sequence of steps: substrate wafers of single crystal silicon having a diameter of 300 mm were subjected to DSP. The wafer was polished to a target thickness of 768 µm. Then, after cleaning and drying the substrates, a constant composition SiGe layer with a Ge content of 70% and a thickness of 2.5 µm µm was deposited in a single wafer CVD reactor on the back side of the substrates. Afterwards, the front side of the substrates was subjected to CMP. 1.0 µm of material was removed from the front side of the substrates. Then, the substrates were subjected to a post-CMP cleaning with pure water. Finally, a graded SiGe layer having a thickness of 5 µm was deposited on the front side of the substrates to produce heteroepitaxial wafers having a stress compensating back side layer. The concentration of Ge in the graded SiGe layer was graded from 0 to 70% Ge. Afterwards a layer of 1 µm constant composition SiGe (70% Ge) was deposited. The deposition gas for depositing the stress compensating layer and the heteroepitaxial layer was a mixture of $SiCl_2H_2$ and $GeCl_4$ in hydrogen as a carrier gas.

Comparative Example 1

For the purpose of comparison, further heteroepitaxial wafers were produced having the same front and back side heteroepitaxial layers as in the example but were produced according to a method distinct to the invention: (1) double side polishing to a standard wafer thickness (773 µm) and (2) CMP of the front side with 0.3 µm removal. Afterwards as step (3) the constant composition SCL was deposited on the back side and as step (4) the 5 µm graded buffer and 1 µm constant composition SiGe (70% Ge) was deposited on the front side.

Comparative Example 2

Also for the purpose of comparison, heteroepitaxial wafers without a SCL on the back side (schematically depicted in FIG. 4) were produced by performing the following sequence of steps: (1) double side polishing to a standard wafer thickness (773 µm), (2) standard CMP of the front side with 0.3 µm removal, and (3) deposition of the 5 µm graded buffer and 1 µm constant composition SiGe (70% Ge) on the front side.

The heteroepitaxial wafers produced in accordance with the example and comparative examples 1 and 2 were analyzed in view of key parameters representing bow, warp, global and local flatness, as well as nanotopography. The results are displayed in the following table.

TABLE

|  | Comparative Example 1 | Comparative Example 2 | Example 1 |
|---|---|---|---|
| Bow/µm | 2 | −169 | 1 |
| Warp/µm | 32 | 305 | 28 |
| SFQR max/nm (26 mm * 8 mm, 336 sites) (2 sigma) | 100 | 57 | 63 |
| SBIR max/nm (26 mm * 8 mm, 336 sites) (2 sigma) | 500 | 250 | 240 |
| Total wafer thickness/µm | 782 | 779 | 776 |
| 4 mm THA/nm (2 sigma) | 46 | 50 | 15 |
| 10 mm THA/nm (2 sigma) | 78 | 100 | 32 |

Geometry data were measured using a ADE-AFS tool. Nanotopography was measured on an ADE Nanomapper device according to SEMI standard M43.

The results clearly show that the claimed method leads to an improved quality of the wafers in view of almost all of the key parameters regarding wafer geometry and nanotopography if compared to Comparative Examples 1 and 2.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for producing a wafer comprising a silicon single crystal substrate having a front and a back side and a layer of SiGe deposited on the front side, the method comprising steps in the following order:
simultaneously polishing the front and the back side of the silicon single crystal substrate;

depositing a stress compensating layer on the back side of the silicon single crystal substrate;

polishing the front side of the silicon single crystal substrate;

cleaning the silicon single crystal substrate having the stress compensating layer deposited on the back side; and depositing a fully or partially relaxed layer of SiGe on the front side of the silicon single crystal substrate.

2. The method of claim 1, further comprising: depositing a silicon cap layer on the stress compensating layer.

3. The method of claim 1, further comprising: polishing an edge and a notch of the wafer comprising the silicon single crystal substrate with the stress compensating layer deposited on the back side and the heteroepitaxial layer of SiGe deposited on the front side of the silicon single crystal substrate.

4. The method of claim 1, further comprising: polishing and cleaning the heteroepitaxial layer of SiGe deposited on the front side of the silicon single crystal substrate.

5. The method of claim 1, further comprising: depositing one or more further epitaxial layers on the SiGe layer deposited on the front side of the silicon single crystal substrate.

6. The method of claim 5, comprising polishing the front side of the wafer before depositing a further epitaxial layer, wherein polishing is performed as chemical mechanical polishing in the presence of a slurry containing abrasive particles or as fixed abrasive polishing in the absence of a slurry containing abrasive particles.

* * * * *